United States Patent [19]

Sauer

[11] Patent Number: 5,963,085

[45] Date of Patent: Oct. 5, 1999

[54] INPUT TO OUTPUT STAGE INTERFACE WITH VIRTUAL GROUND CIRCUITRY FOR RAIL TO RAIL COMPARATOR

[75] Inventor: Donald R. Sauer, San Jose, Calif.

[73] Assignee: National Semiconductor Corporation, Santa Clara, Calif.

[21] Appl. No.: 09/078,983

[22] Filed: May 14, 1998

[51] Int. Cl.[6] .................................................. H03F 1/02
[52] U.S. Cl. ............................................. 330/9; 330/300
[58] Field of Search ............................... 330/9, 252, 253, 330/300; 327/124, 307, 319, 321

[56] References Cited

U.S. PATENT DOCUMENTS

| | | | |
|---|---|---|---|
| 4,284,959 | 8/1981 | Heagerty et al. | 330/253 |
| 4,333,058 | 6/1982 | Hoover | 330/253 |
| 4,532,479 | 7/1985 | Blauschild | 330/261 |
| 4,555,673 | 11/1985 | Huijsing et al. | 330/258 |
| 4,560,947 | 12/1985 | Frey | 330/254 |
| 4,600,893 | 7/1986 | Sugimoto | 330/252 |
| 4,797,631 | 1/1989 | Hsu et al. | 330/253 |
| 4,804,904 | 2/1989 | Katakura | 323/312 |
| 5,153,529 | 10/1992 | Koda et al. | 330/295 |
| 5,392,003 | 2/1995 | Nag et al. | 330/300 X |
| 5,414,388 | 5/1995 | Sauer | 330/252 |
| 5,420,540 | 5/1995 | Butler | 330/255 |
| 5,442,318 | 8/1995 | Badyal et al. | 330/253 |
| 5,455,535 | 10/1995 | Sauer | 327/560 |
| 5,491,437 | 2/1996 | Rincon et al. | 330/255 X |
| 5,523,718 | 6/1996 | Butler | 330/255 |
| 5,668,486 | 9/1997 | Brehmer | 327/66 |

*Primary Examiner*—Steven J. Mottola
*Attorney, Agent, or Firm*—Limbach & Limbach L.L.P.

[57] ABSTRACT

An interface stage for interfacing between input and output stages of a rail to rail comparator. The interface stage combines and amplifies four input stage output currents from the input stage, including by common base feeding them to a symmetrical set of virtual grounds, to generate a differential output signal for driving the output stage. In preferred embodiments, the interface stage includes two sets of bipolar transistors, each set connected in a common base configuration, which amplify each input stage output current and assert the resulting amplified signals to a pair of symmetrical virtual ground circuits. Each virtual ground circuit comprises a bipolar transistor and is configured to combine two of the amplified signals to generate one component of the differential output signal. By employing the virtual ground circuits, the slew rate of the interface stage is principally determined by its input transconductance and the collector-to-base stray capacitance of the bipolar transistors of the virtual ground circuits. Thus, since the virtual ground circuits can be implemented with minimum geometry bipolar transistors having very low collector-to-base stray capacitance, the interface stage can be implemented to have very high slew rate. In other embodiments, the invention comprises a rail to rail comparator input stage (having an autozero switch) coupled with an interface stage including autozero circuitry. The autozero circuitry and the autozero switch can be controlled to execute an autozero operation in which DC noise due to offset in the output signal (of the combined input and interface stage) is rapidly attenuated by means of a negative feedback loop.

24 Claims, 4 Drawing Sheets

INPUT TO OUTPUT STAGE INTERFACE WITH VIRTUAL GROUND CIRCUITRY FOR RAIL TO RAIL COMPARATOR

FIELD OF THE INVENTION

The invention pertains to an input to output stage interface for a rail to rail comparator (an intermediate stage between input and output stages) capable of amplifying a differential input signal from the input stage having any potential in the full range from the bottom rail to the top rail with high slew rate (i.e., despite rapid variations in the input signal). The invention can be implemented as a portion of an integrated circuit having very small physical size, using circuit elements having minimum geometry.

BACKGROUND OF THE INVENTION

Typically, each of a rail to rail comparator and a rail to rail includes three stages: an input stage, an intermediate stage, and an output stage. The input and intermediate stages provide sufficient gain to each input signal, to enable final processing in the output stage.

Examples of conventional rail to rail operational amplifier input stages are disclosed in U.S. Pat. No. 5,414,388, issued May 9, 1995, and U.S. Pat. No. 5,455,535, issued Oct. 3, 1995, both assigned to the assignee of the present invention. U.S. Pat. No. 5,455,535 also discloses several embodiments of a conventional intermediate stage for a rail to rail operational amplifier, for amplifying a differential output signal from the input stage disclosed therein.

Conventional input stage circuitry (and combined input and intermediate stage circuitry) for use in an operational amplifier is typically designed to have high gain and good stability, and as a result is too slow (in the sense that its slew rate is too low) for use as the input stage (or combined input and intermediate stage) of many desired implementations of rail to rail comparators (in which high slew rate is critical, and less gain and stability can be tolerated).

Further, typical conventional input stage (and combined input and intermediate stage) circuitry for rail to rail comparators cannot be implemented with components of minimum geometry, and thus the comparators cannot be implemented in integrated circuits having sufficiently small physical size for many desired applications.

SUMMARY OF THE INVENTION

In a first class of embodiments, the invention is an interface stage for interfacing between an input stage and an output stage of a rail to rail comparator. The inventive interface stage combines and amplifies four input stage output currents from the input stage, common base feeding them to a symmetrical set of virtual grounds, to generate a differential output signal suitable for driving the comparator output stage. In this class of embodiments, the inventive interface stage preferably includes two sets of bipolar transistors (the transistors in each set being connected in a common base configuration, and preferably having minimum geometry) which amplify each input stage output current and assert the four resulting amplified signals to a pair of symmetrical virtual ground circuits. Each virtual ground circuit comprises a bipolar transistor (preferably having minimum geometry) and is configured to combine two of the amplified signals to generate one of the two signals comprising the differential output signal.

As a result of employing the virtual ground circuits, the slew rate of the interface stage is principally determined by its input transconductance and the collector-to-base stray capacitance of the bipolar transistors of the virtual ground circuits. Thus, since the virtual ground circuits can be implemented with minimum geometry bipolar transistors having very low collector-to-base stray capacitance, the inventive interface stage can be implemented with very high slew rate.

In preferred embodiments, both the interface stage and the input stage to which it is designed to interface are connected between top and bottom power supply rails (in turn connected to a source of operating power), and the input stage comprises a top rail portion (preferably including a pair of NMOS transistors) which asserts a first output current and a second output current (together comprising a first amplified differential input signal for the interface stage) in response to a differential input potential, and a bottom rail portion (preferably including a pair of PMOS transistors) which asserts a third output current and a fourth output current (together comprising a second amplified differential input signal for the interface stage) in response to the differential input potential. The first amplified differential input signal is indicative of the differential input potential over its full range (except for values very close to the bottom rail potential). The second amplified differential input signal is indicative of the differential input potential over its full range (except for values of very close to the top rail potential). One virtual ground circuit asserts an output potential (one component of the differential output signal) indicative of a linear combination of the first output current and the third output current. The other virtual ground circuit asserts a second output potential (the other component of the differential output signal) indicative of a linear combination of the second output current and the fourth output current. The differential output potential (asserted by the interface stage) is thus indicative of a linear combination of the four output currents from the input stage (and the differential output potential changes in response to each change in the linear combination of four output currents) over all common mode values of the differential input potential (from bottom rail to top rail potential, and preferably from below the bottom rail potential to above the top rail potential).

In a second class of embodiments, the invention comprises a comparator input stage (having an autozero switch) and an interface stage including autozero circuitry. Preferably, the interface stage is a member of the first class of embodiments, modified to include the autozero circuitry. The autozero circuitry (in the interface stage) and the autozero switch (in the input stage) can be controlled to execute an autozero operation in which DC noise (due to offset) in the output signal (of the combined input and interface stage) is rapidly attenuated by means of a negative feedback loop.

DETAILED DESCRIPTION OF THE INVENTION

Figure 1:
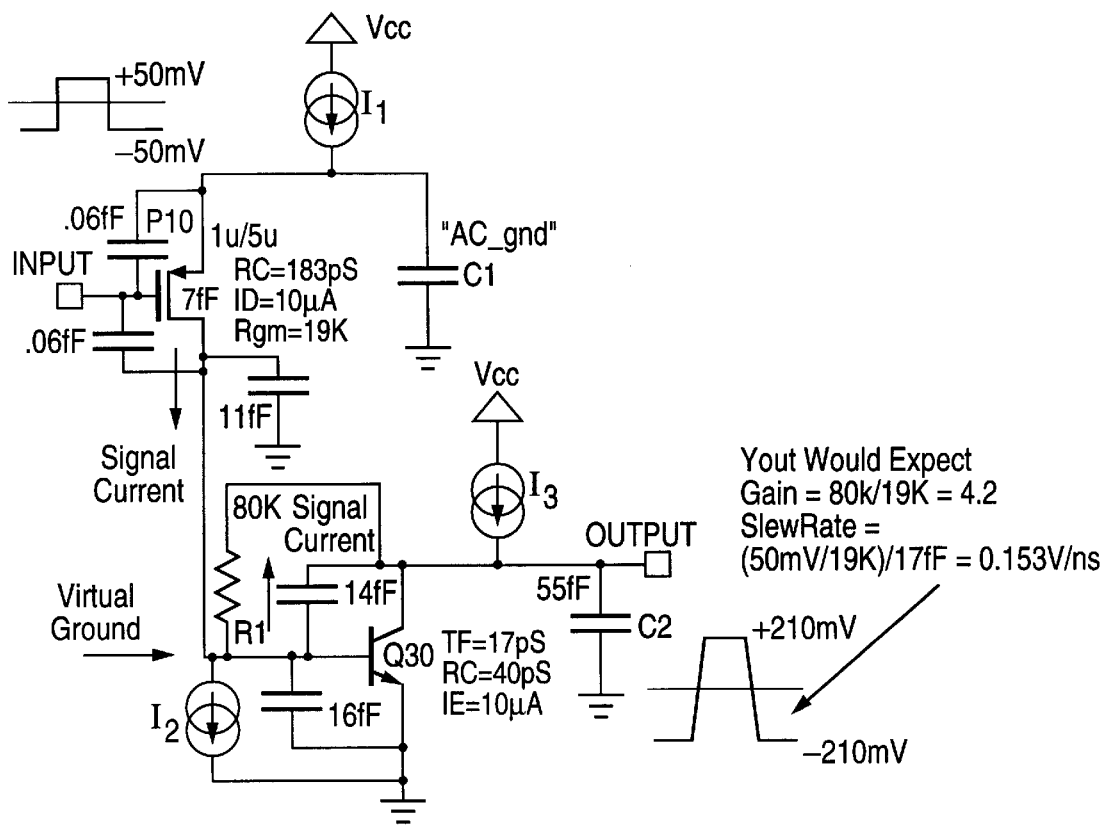
FIG. 1 is a schematic diagram illustrating the bottom side of an input stage for an ideal comparator. The input stage bottom side includes one PMOS transistor and virtual ground circuitry comprising a resistor and an NPN bipolar transistor. A complementary "top side" of the input stage is typically also provided, to implement the comparator as a rail to rail comparator capable of operating in response to input potentials very near to the top rail potential (as well as those very near to the bottom rail potential).

The principle of the invention will be described initially with reference to FIG. 1. FIG. 1 is a schematic diagram illustrating the bottom side of an input stage for an ideal comparator. The input stage bottom side includes PMOS transistor P1 and virtual ground circuitry comprising resistor R1 and NPN bipolar transistor Q30. Current source I1 is coupled between the $V_{cc}$ rail and the source of transistor P1, current sink I2 is coupled between the bottom rail (ground) and the drain of transistor P1, and current source I3 is coupled between the $V_{cc}$ rail and the collector of transistor Q30. Capacitor C1 is connected between current source I1 and ground to provide an AC ground. The symbol C2 represents stray capacitance of the FIG. 1 circuitry.

The input stage bottom side shown in FIG. 1 (and the input stage of which the FIG. 1 circuitry is a part) amplifies the input signal received at the INPUT node, to produce an output signal at the OUTPUT node which is asserted to the next stage of the comparator. A complementary "top side" of the input stage would typically also be provided, to implement the comparator as a rail to rail comparator capable of operating in response to input potentials very near to the top rail potential (as well as those very near to the bottom rail potential). Such a top side of the input stage would include an NMOS transistor whose gate receives the input signal (IN) and whose source is coupled to a current sink. The top side input stage should produce a second output signal current which is indicative of the magnitude of the input signal (in response to values of the input signal except values so near the bottom rail potential as to turn off the NMOS transistor).

One would expect the speed of the ideal comparator to be determined by the amplitude ($V_i$) of the input signal, the input transconductance ($g_m$=change in output signal current divided by the change in input signal amplitude which results in such change in output signal current), and the capacitance (C) of the input stage (the capacitance C is ideally minimized, and provided by the minimal stray capacitances of the transistors employed). Specifically, one would expect the slew rate of the input stage to be $V_i(g_m)/(C)$. The degree to which a comparator input stage is ideal can be defined as the degree to which its slew rate is determined by the ratio of input transconductance ($g_m$) to capacitance. Assuming the ideal input stage bottom side of FIG. 1 is implemented as part of an integrated circuit with components having the characteristics (including stray capacitances) indicated in FIG. 1 (e.g., $g_m$=19 KiloOhms, the collector-to-base stray capacitance of transistor Q30 is 14 fF, the emitter-to-base stray capacitance of transistor Q30 is 16 fF), assuming that NPN transistor Q30 has minimum geometry, and assuming a square wave input signal at the INPUT node (of 100 mV peak-to-peak amplitude), the slew rate of the FIG. 1 circuit would be 50 mV/(19 KiloOhms)(17 fF)=0.15 V/ns.

By using virtual ground circuitry (e.g., resistor R1 and transistor Q30 connected as shown in FIG. 1) in an ideal comparator input stage, the signal current (drawn from the output of the stage) can be driven by a very small collector-to-base stray capacitance of a transistor having minimum geometry (e.g., the channel current of transistor P10 can be sucked up by a small collector-to-base stray capacitance of NPN bipolar transistor Q30). The collector current of the minimum geometry transistor can be adjusted so that its substrate capacitance does not dominate.

An important aspect of the invention is to employ virtual ground circuitry of the type shown in FIG. 1, in an interface stage which provides an interface between an input stage and an output stage of a rail to rail comparator, in order to cause the slew rate (of the combined input and interface stages) to be dominated by the ratio of input transconductance ($g_m$) to stray capacitance, and to minimize the stray capacitance and thus maximize the slew rate of the combined input and interface stages.

Figure 2:
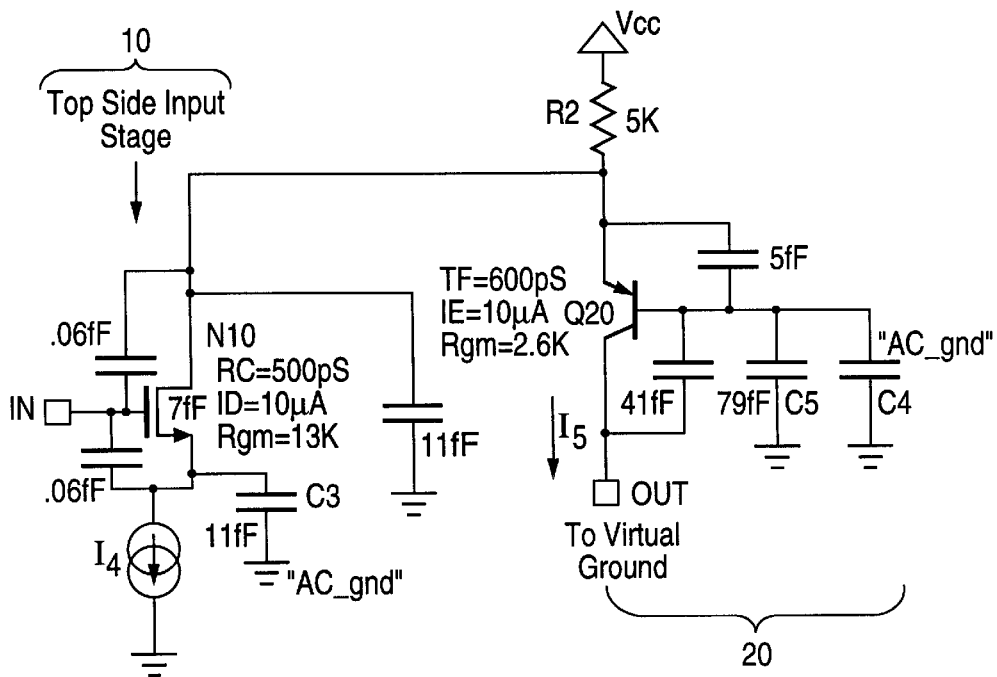
FIG. 2 is a schematic diagram illustrating the principle of the inventive comparator intermediate stage, when used with a prior art comparator input stage comprising one NMOS transistor.

FIG. 2 is a schematic diagram of a comparator input stage interface 20 (illustrating the principle of the FIG. 3 embodiment of the inventive comparator input stage interface), with a conventional comparator input stage 10. FIG. 2 does not show the output stage of the comparator, but it contemplates that the output signal asserted at node "OUT" of interface 20 is provided to the output stage, and that the comparator output stage includes virtual ground circuitry such as that discussed with reference to FIG. 1. Input stage 10 comprises NMOS transistor N10, and current sink I4 connected to transistor N10's source as shown to cause channel current to flow from resistor R2 of interface 20 through transistor N10 when input signal IN (asserted to N10's gate) is sufficiently high to turn on transistor N10. The capacitance C3 between the source of transistor N10 and ground provides an AC ground. Current sink I4 corresponds to current source I1 of FIG. 1.

Interface 20 comprises lateral PNP bipolar transistor Q20, whose emitter is connected to resistor R2 and whose collector is connected to node "OUT" (and thus to the virtual ground circuitry within the output stage) as shown. The capacitance (C4 and C5) between the base of transistor Q20 and ground provides an AC ground. Transistor Q20 is used in a common base configuration, in which signal current is applied at its emitter while its base is grounded.

In preferred implementations of FIG. 2, the components have the characteristics shown in FIG. 2 (e.g., transistor N10 has transconductance $g_m$=13 KiloOhms, resistor R2 has a resistance of 5 KiloOhms, and transistor Q20 has emitter-to-base stray capacitance of 5 fF, collector-to-base stray capacitance of 41 fF, and minimum geometry). Given that the stray base capacitance of transistor Q20 is sufficiently large, external capacitance is not needed to implement the AC ground for transistor Q20's base.

In response to an increase in input potential IN (assuming IN is sufficiently high to turn on transistor N10), more current is drawn from the top rail through resistor R2 and transistor N10. Thus, the potential difference across resistor R2 increases with the result that the potential at transistor Q20's emitter falls and there is a decrease in signal current drawn by the output stage from transistor Q20 through output node OUT. The signal current decrease is indicative of the magnitude of the input potential increase.

In operation, the drain of transistor N10 must go to a potential very close to the top rail potential ($V_{cc}$) in order for input stage 10 to provide signal current in response to values of input potential IN which exceed the top rail potential.

Since transistor N1 turns off when input potential IN falls below the turn on potential of transistor N1, a complementary "bottom side" input stage is needed (in addition to "top side" input stage 10) to implement the comparator as a rail to rail comparator capable of operating in response to input potentials very near to the bottom rail potential (as well as those very near to the top rail potential). The bottom side input stage would include a PMOS transistor whose gate receives the input signal (IN) and whose source is coupled to a current sink. The bottom side input stage should produce a second output signal current which is indicative of the magnitude of the input signal (in response to values of the input signal except values so near the top rail potential as to turn off the PMOS transistor), so that the output signal current from the top side input stage and the second output signal current from the bottom side input stage together indicate the magnitude of the input signal (in response to all values of the input signal in the full range from the bottom rail to top rail potential).

With reference to FIG. 2, resistor R2 can be replaced by a current source (e.g., a counterpart to current source I2 of FIG. 1), with the advantage that signal attenuation by the resistor is eliminated. However, the signal attenuation due to resistor R2 can be tolerated in many applications. Advantages of using resistor R2 (rather than a current source) include the following: the resistor is simpler and less expensive to implement; good matching can be achieved between resistor R2 and bipolar transistor Q20; and use of the resistor reduces stray capacitance (and thus increases the slew rate of the FIG. 2 circuitry).

A preferred embodiment of the invention will next be described with reference to FIG. 3. The FIG. 3 circuit comprises conventional comparator input stage 30 and interface stage 40. Interface stage 40 embodies the invention, and is intended to provide an interface between comparator input stage 30 (connected to stage 40 at the nodes labeled $V_1$, $V_2$, $V_3$, and $V_4$) and a comparator output stage (connected to stage 40 at the nodes labeled OUT+ and OUT-).

Input stage 30 comprises a top rail portion comprising NMOS transistors N1 and N2 (whose sources are connected together) and current sink $I_T$ connected between the bottom rail and the sources of transistors N1 and N2, and a bottom rail portion comprising PMOS transistors P1 and P2 (whose sources are connected together) and current source $I_B$ connected between the top rail and the sources of transistors P1 and P2.

Input stage 30 receives a differential input potential at input node IN+ (coupled to the gates of transistors N1 and P1) and input node IN- (coupled to the gates of transistors N2 and P2). The differential input potential consists of a first input potential supplied to node IN+ (and thus referred to as input potential IN+) and a second input potential supplied to node IN- (and thus referred to as input potential IN-).

Transistors N1 and N2 are operated differentially (with current sink $I_T$ drawing a constant tail current from their sources) to provide a first amplified differential signal at nodes $V_1$ and $V_2$. Transistors P1 and P2 are operated differentially (with current source $I_B$ providing a constant current to their connected sources) to provide a second amplified differential signal at nodes $V_3$ and $V_4$.

In the case that the common mode level of the differential input potential is such that all of transistors N1, N2, P1, and P2 are on (i.e., IN+ and IN- are above the turn on potential of N1 and N2 and below the turn off potential of P1 and P2), in response to a simultaneous increase in input potential IN+ and a corresponding decrease in input potential IN-:

an increased current is drawn through transistor N1 (from the top rail through resistor R7 of stage 40 and node $V_1$);

a decreased current is drawn through transistor N2 (from the top rail through resistor R3 of stage 40 and node $V_2$);

a decreased current is drawn through transistor P1 (through node $V_4$ and resistor R10 of stage 40 to the bottom rail); and an increased current is drawn through transistor P2 (through node $V_3$ and resistor R8 of stage 40 to the bottom rail).

Interface stage 40 includes PNP bipolar transistors Q3, Q4, Q5, Q6, and Q7, whose emitters are connected through resistor R3, R4, R5, R6, and R7, respectively, to the top rail and whose bases are connected together. Current sink $I_D$ between the bottom rail and the common bases of transistors Q3–Q7 (and capacitance C6 in parallel with current sink $I_D$) bias the transistors Q3–Q7 appropriately and implement an AC ground for the common bases. Given that the stray base capacitances of transistors Q3–Q7 are sufficiently large, external capacitance is not needed to implement the AC ground for the common bases of transistors Q3–Q7. Transistor Q5 is diode connected, with its collector connected to its base as shown. Transistors Q3 and Q7 are used in a common base configuration in which signal currents are applied at their emitters while their bases are AC grounded, and transistors Q3–Q7 all preferably have minimum geometry.

The collector of transistor Q3 is coupled to node A, the collector of transistor Q4 is coupled to output node OUT+, the collector of transistor Q7 is coupled to node B, and the collector of transistor Q6 is coupled to output node OUT-.

Interface stage 40 also includes NPN bipolar transistor Q10, Q11, and Q12, whose emitters are connected through resistor R8, R9, and R10, respectively, to the bottom rail, and whose bases are connected together. Transistor Q11 is diode connected, with its collector connected to its base as shown. Capacitance C7 (between the common bases of transistors Q10–Q12 and the bottom rail) and diode connected transistor Q11 function to bias transistors Q8, Q9, Q10, and Q12 appropriately (to keep transistors Q8–Q11 and Q12 out of saturation), to provide an AC ground for the common bases of Q10 and Q12, and implement an output DC level adjustment which determines the DC level of the output signal provided (at nodes OUT+ and OUT-) to the output stage in response to "zero" input potential (i.e., in response to IN+=IN- being in the middle of the range between the top and bottom rail potentials). Given that the stray base capacitances of transistors Q10–Q12 are sufficiently large, external capacitance is not needed to implement capacitance C7. The collector of transistor Q10 is coupled to node A. The collector of transistor Q12 is coupled to node B. Transistors Q10 and Q12 are used in a common base configuration in which signal currents are applied at their emitters while their bases are AC grounded. Transistors Q10–Q12 all preferably have minimum geometry.

Figure 3:
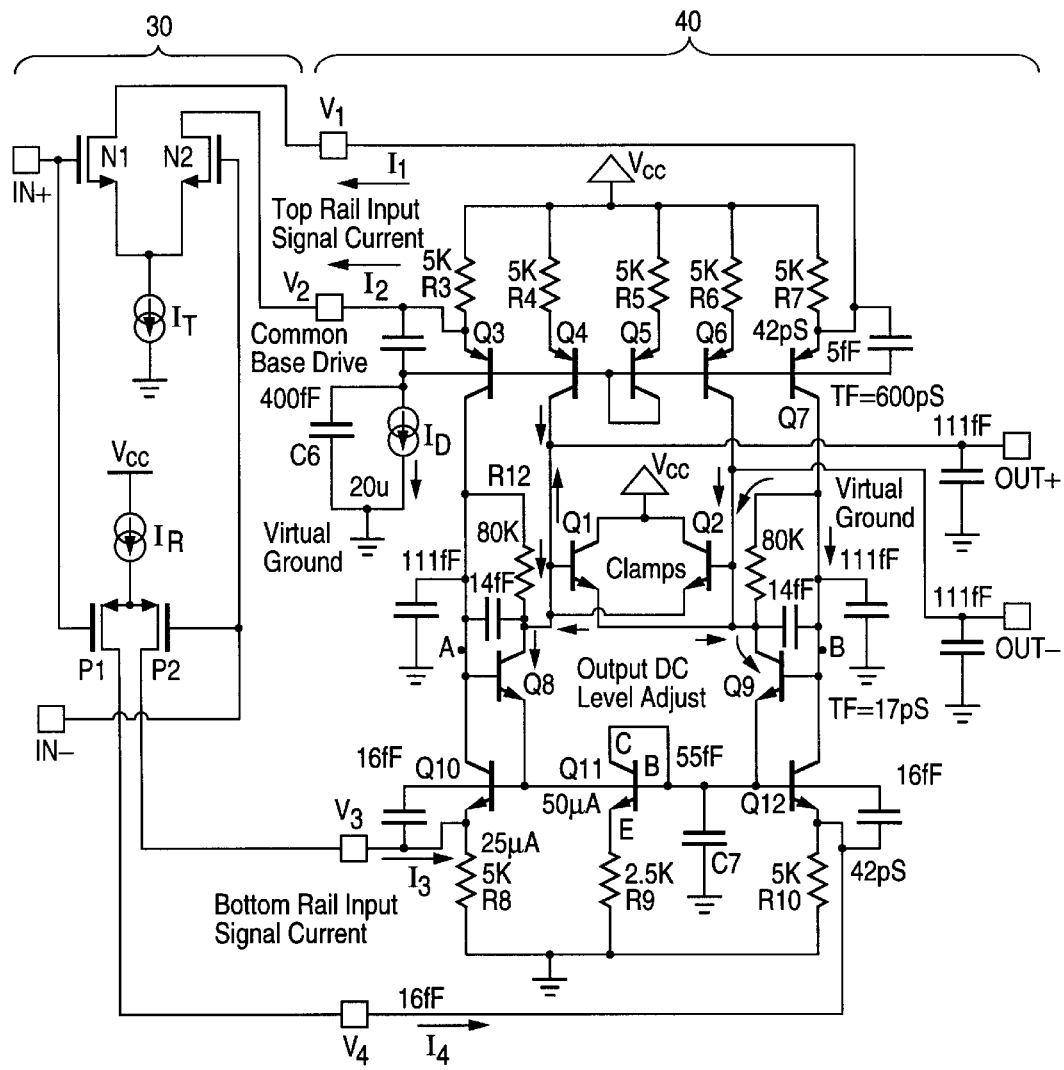
FIG. 3 is a simplified schematic diagram illustrating a preferred embodiment of the inventive comparator intermediate stage (comprising five pnp bipolar transistors with their bases connected together and three npn bipolar transistors with their bases connected together), coupled with a prior art comparator input stage (comprising two PMOS transistors and two NMOS transistors).

Interface stage 40 also includes virtual ground circuitry, which is an important aspect of its design which increases the slew rate of the FIG. 3 circuit. Specifically, resistor R12 and NPN bipolar transistor Q8 connected as shown (with resistor R12 connected between node A and output node OUT+) provide a virtual ground at node A (the base of transistor Q8), and resistor R11 and NPN bipolar transistor Q9 connected as shown (with resistor R11 connected between node B and output node OUT–) provide another virtual ground at node B (the base of transistor Q9). Thus, the potential at node A does not change despite changes in the differential input signal at nodes IN+ and IN–, although the collector currents of transistors Q3 and Q10 are free to change independently and rapidly in response to changes in the differential input signal. Transistors Q8 and Q9 (like the other bipolar transistors of FIG. 3) preferably have minimum geometry, and low stray collector-to-base stray capacitance. Similarly, the potential at node B does not change despite changes in the differential input signal at nodes IN+ and IN–, although the collector currents of transistors Q7 and Q12 are free to change independently and rapidly in response to changes in the differential input signal. As a result of the virtual ground at node A, the slew rate for output signal OUT+ is dominated by the very low (14 fF) stray capacitance coupled to node A (between the collector and base of transistor Q8 as indicated in FIG. 3) rather than the much larger (111 fF) capacitance coupled between node A and the bottom rail (as indicated in FIG. 3). The fact that the slew rate is dominated by this reduced capacitance results in substantially increased slew rate for stage 40. Similarly, as a result of the virtual ground at node B, the slew rate for output signal OUT– is dominated by the very low (14 fF) stray capacitance coupled to node B between the collector and base of transistor Q9 as indicated in FIG. 3) rather than the much larger (111 fF) capacitance coupled between node B and the bottom rail (as indicated in FIG. 3). The fact that the slew rate is dominated by this reduced capacitance also results in substantially increased slew rate for stage 40.

The clamp circuitry comprising NPN bipolar transistors Q1 and Q2, connected as shown, is provided to bias transistors Q8 and Q9, to assist in keeping transistors Q8 and Q9 out of saturation. The collectors of Q1 and Q2 are connected to the top rail, the base of Q1 and the emitter of Q2 are coupled to output node OUT+, and the base of Q2 and the emitter of Q1 are coupled to output node OUT–.

In preferred embodiments, all of resistors R3–R7, R8, and R10 are matched (they all have 5000 ohm resistance in the implementation shown in FIG. 3), and resistor R11 is matched to R12 (they both have 80,000 ohm resistance in the implementation shown in FIG. 3).

Preferably, the FIG. 3 circuit is implemented with characteristics of its components that are chosen so that the output (at nodes OUT+ and OUT–) is indicative of the differential input potential over a broader-than-full range (i.e., over all values of each of components IN+and IN– of the differential input potential in a range exceeding the full range from bottom rail to top rail potential). The drain of each of transistors N1 and N2 must go to a potential very close to the top rail potential, and the drain of each of transistors P1 and P2 must go to a potential very close to the bottom rail potential, in order for the signal current provided (by input stage 30) to interface stage 40 to be indicative of the differential input potential over a broader-than-full range.

In operation of the FIG. 3 circuit, when the differential input signal increases (i.e., when potential IN+ rises and potential IN– falls relative to the top rail potential $V_{cc}$), the circuit responds as follows (assuming initially that both IN+ and IN– are in the midrange, above the turn on potential of NMOS transistors N1 and N2, and below the turn off potentials of PMOS transistors P1 and P2):

the current I1 through transistor N1 (and node $V_1$) increases and current I2 through transistor N2 (and node $V_2$) decreases. Thus, the current through R3 decreases, and the potential of transistor Q3's emitter rises. Also, the current through R7 increases, and the potential of transistor Q7's emitter thus falls. Thus, the collector current ($I_{Q3}$) of transistor Q3 increases and the collector current ($I_{Q7}$) of transistor Q7 decreases (transistors Q4 and Q6 are biasing devices whose collector currents $I_{Q6}$ and $I_{Q4}$ do not change significantly); and the current I4 through transistor P1 (and node $V_4$) decreases and the current I3 through transistor P2 (and node $V_3$) increases. Thus, the current through resistor R10 decreases and the potential of transistor Q12's emitter accordingly falls, and the current through resistor R8 increases and the potential of transistor Q10's emitter accordingly rises. Thus the collector current ($I_{Q12}$) of transistor Q12 increases, and the collector current of transistor Q10 ($I_{Q10}$) decreases.

The output potential OUT+ (at output node OUT+) is proportional to $I_{Q4}+I_{Q3}-I_{Q8}+I_{Q2}-I_{Q10}$, and the output potential OUT– (at output node OUT–) is proportional to $I_{Q7}+I_{Q6}+I_{Q1}-I_{Q9}-I_{Q12}$, where $I_{Q8}$ is the collector current of transistor Q8, $I_{Q2}$ is the collector current of transistor Q2, $I_{Q9}$ is the collector current of transistor Q9, and $I_{Q1}$ is the collector current of transistor Q1.

Thus, in response to potential IN+ rising and potential IN– falling relative to the top rail potential (with both IN+ and IN– above the turn on potential of transistors N1 and N2, and below the turn off potentials of transistors P1 and P2), the potential difference (OUT+)–(OUT–) changes by an amount proportional to the increase in the difference (IN+)–(IN–).

When the differential input voltage decreases (i.e., when potential IN+ falls and potential IN– rises relative to the top rail potential $V_{cc}$), assuming that both IN+ and IN– are above the turn on potential of transistors N1 and N2, and below the turn off potentials of transistors P1 and P2 (so that N1, N2, P1, and P2 are on), the FIG. 3 circuit responds as follows:

the current I1 through transistor N1 (and node $V_1$) decreases and current I2 through transistor N2 (and node $V_2$) increases. Thus, the collector current ($I_{Q3}$) of transistor Q3 decreases, and the collector current ($I_{Q7}$) of transistor Q7 increases; and the current I4 through transistor P1 (and node $V_4$) decreases and the current I3 through transistor P2 (and node $V_3$) increases. Thus the collector current ($I_{Q2}$) of transistor Q12 decreases, and the collector current of transistor Q10 ($I_{Q10}$) increases.

Thus, the potential difference (OUT+)–(OUT–) changes by an amount proportional to the decrease in the difference (IN+)–(IN–).

If both IN– and IN+ are very close to the top rail potential (i.e., if both IN– and IN+ are above the turn on potentials of transistors N1 and N2 and above the turn off potentials of P1 and P2, SO that N1 and N2 are on and P1 and P2 are off), the FIG. 3 circuit operates as follows in response to IN+ rising and IN– falling relative to the top rail potential:

the current I1 through transistor N1 increases and current I2 through transistor N2 decreases. Thus, the potential of transistor Q3's emitter rises, the potential of Q4's emitter also rises, the potential of Q7's emitter falls, and the potential of Q6's emitter also falls. Thus the collector current ($I_{Q3}$) of Q3 increases, and the collector current ($I_{Q7}$) of Q7 decreases; and the collector currents of transistors Q12 and Q10 do not change, and instead they remain at the values to which they are biased in response to a "zero" differential input potential (i.e., in response to IN+=IN− being in the middle of the range between the top and bottom rail potentials).

Thus, the potential difference (OUT+)−(OUT−) changes by an amount corresponding to the increase in the difference (IN+)−(IN−), but with less gain than in the case that IN+ and IN− are below the turn off potentials of transistors P1 and P2 and above the turn on potentials of N1 and N2).

Conversely, if both IN− and IN+ are above the turn on potentials of transistors N1 and N2 and above the turn off potentials of P1 and P2, so that N1 and N2 are on but P1 and P2 are off), the FIG. 3 circuit operates as follows in response to IN+ falling and IN− rising relative to the top rail potential: the potential difference (OUT+)−(OUT−) changes by an amount corresponding to the decrease in the difference (IN+)−(IN−), but with less gain than in the case that IN+and IN− are below the turn off potentials of transistors P1 and P2 and above the turn on potentials of N1 and N2).

If both IN− and IN+ are very close to the bottom rail potential (i.e., both IN− and IN+ are below the turn on potentials of transistors N1 and N2, as well as below the turn off potentials of transistors P1 and P2, so that P1 and P2 are on but N1 and N2 are off), the FIG. 3 circuit operates as follows in response to a decrease in the differential input signal (i.e., in response to IN+ falling and IN− rising relative to the top rail potential):

the collector currents of transistors Q3 and Q7 do not change, and instead they remain at the values to which they are biased in response to a "zero" differential input potential (i.e., in response to IN+=IN− being in the middle of the range between the top and bottom rail potentials); and the potential difference (OUT+)−(OUT−) changes by an amount corresponding to the decrease in the difference (IN+)−(IN−), but with less gain than in the case that IN+and IN− are below the turn off potentials of transistors P1 and P2 and above the turn on potentials of N1 and N2.

Conversely, if both IN− and IN+ are below the turn on potentials of transistors N1 and N2 and below the turn off potentials of transistors P1 and P2 (so that P1 and P2 are on but N1 and N2 are off), the FIG. 3 circuit operates as follows in response to IN+ rising and IN− falling relative to the top rail potential: the potential difference (OUT+)−(OUT−) changes by an amount corresponding to the increase in the difference (IN+)−(IN−), but with less gain than in the case that IN+and IN− are below the turn off potentials of transistors P1 and P2 and above the turn on potentials of N1 and N2.

Figure 4:
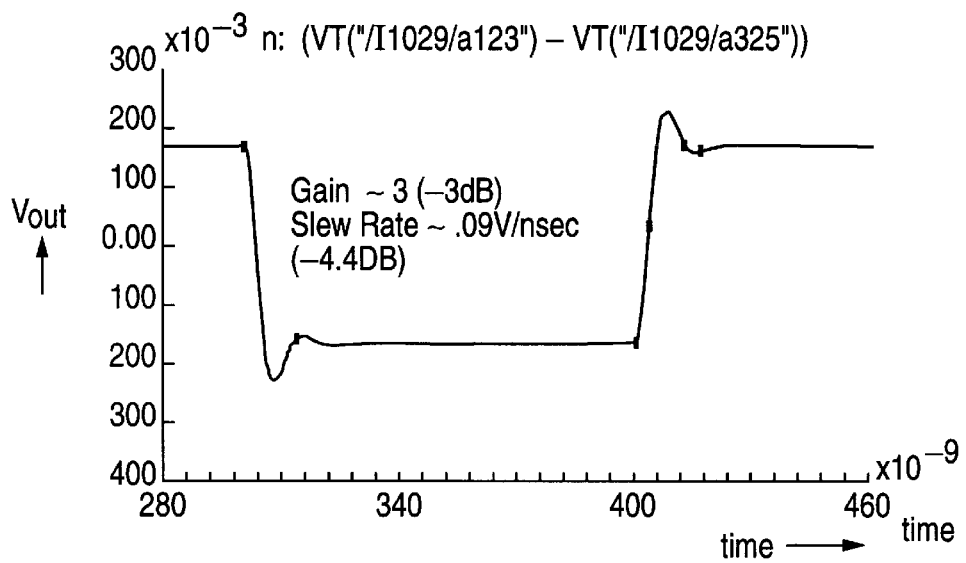
FIG. 4 is a graph of potential difference between output nodes OUT+ and OUT− of the FIG. 3 circuit (with transistors P1 and P2 coupled to stage 40 as shown, but with transistors N1 and N2 decoupled from stage 40) versus time, in response to a square wave differential input potential.

Preferably, the FIG. 3 circuitry is implemented to behave as closely as possible as the ideal stage of FIG. 1 (with the additional capability of rail-to-rail operation). Thus, the FIG. 3 circuitry is preferably implemented so that its slew rate is determined by the ratio of its input transconductance ($g_m$) to its capacitance. FIG. 4 is a graph of output potential (potential difference between output nodes OUT+and OUT−) of the FIG. 3 circuit (with transistors P1 and P2 coupled to stage 40 as shown, but with transistors N1 and N2 decoupled from stage 40) versus time, in response to a square wave differential input potential (having 100 mV peak-to-peak amplitude). Use of resistors R8 and F10 in the FIG. 3 embodiment (rather than a fixed current source, as in alternative embodiments) does attenuate the output signal (the amplitude of the FIG. 4 output signal is about 3 dB less than ideal). The slew rate is only slightly less than ideal. With all of input stage transistors N1, N2, P1, and P2 coupled to stage 4 as shown in FIG. 3 (so that the FIG. 3 circuit operates with increased stray capacitance), the slew rate would be degraded by only an additional 1.4 dB below the ideal slew rate.

Except in that it employs one bias current sink $I_D$, stage 40 of FIG. 3 is self-biasing. The transistors of stage 40 are biased so that they operate in the intended manner over the entire common-mode operating range of input stage 30. Preferably, the characteristics of the components of FIG. 3 are selected so that, in response to a "zero" input potential (i.e., in response to IN+=IN− being at the mid-point of the range between the top and bottom rail potentials), both output potential OUT+ and output potential OUT− are at said mid-point.

The offset of a rail-to-rail comparator input stage interface in accordance with the present invention is reduced from the offset of a conventional rail-to-rail comparator input stage interface. Offset results in "DC noise" in the output potential at each of output nodes OUT+ and OUT−, and is typically caused by transistor mismatch. Offset is most evident when there is a non-zero output from stage 40 even in response to "zero" input potential. It is known how to implement bipolar transistors which are suitable for implementing the FIG. 3 circuit and which match to within 2%. Suitable resistors can be implemented which match even better (to within less then 2%).

However, minimum geometry MOS transistors (N1, N2, P1, and P2) are preferably used in input stage 30 (rather than bipolar transistors), since they can be implemented with sufficiently low stray capacitances to achieve sufficiently high desired slew rate. However, when implementing the FIG. 3 circuit with minimum geometry bipolar transistors in stage 40 in a manner achieving acceptably high slew rate and acceptably low offset (and thus acceptably low DC noise) for the overall circuit, the MOS devices in input stage 30 will typically exhibit an offset of about 12 mV standard deviation. Since offset for an MOS device decreases with increasing physical size of the device, the size of input stage 30 would need to be increased by on the order of a factor of 2500 (beyond the size practically achievable if offset were not a constraint) to achieve desired offset values. With MOS transistors of such larger physical size in the input stage, stray capacitance is also increased to be on the order of picoFarads (in contrast with the preferred much lower level of on the order of tens of femtoFarads) which reduces the attainable slew rate for the overall circuit (the combination of stages 30 and 40).

Figure 5:
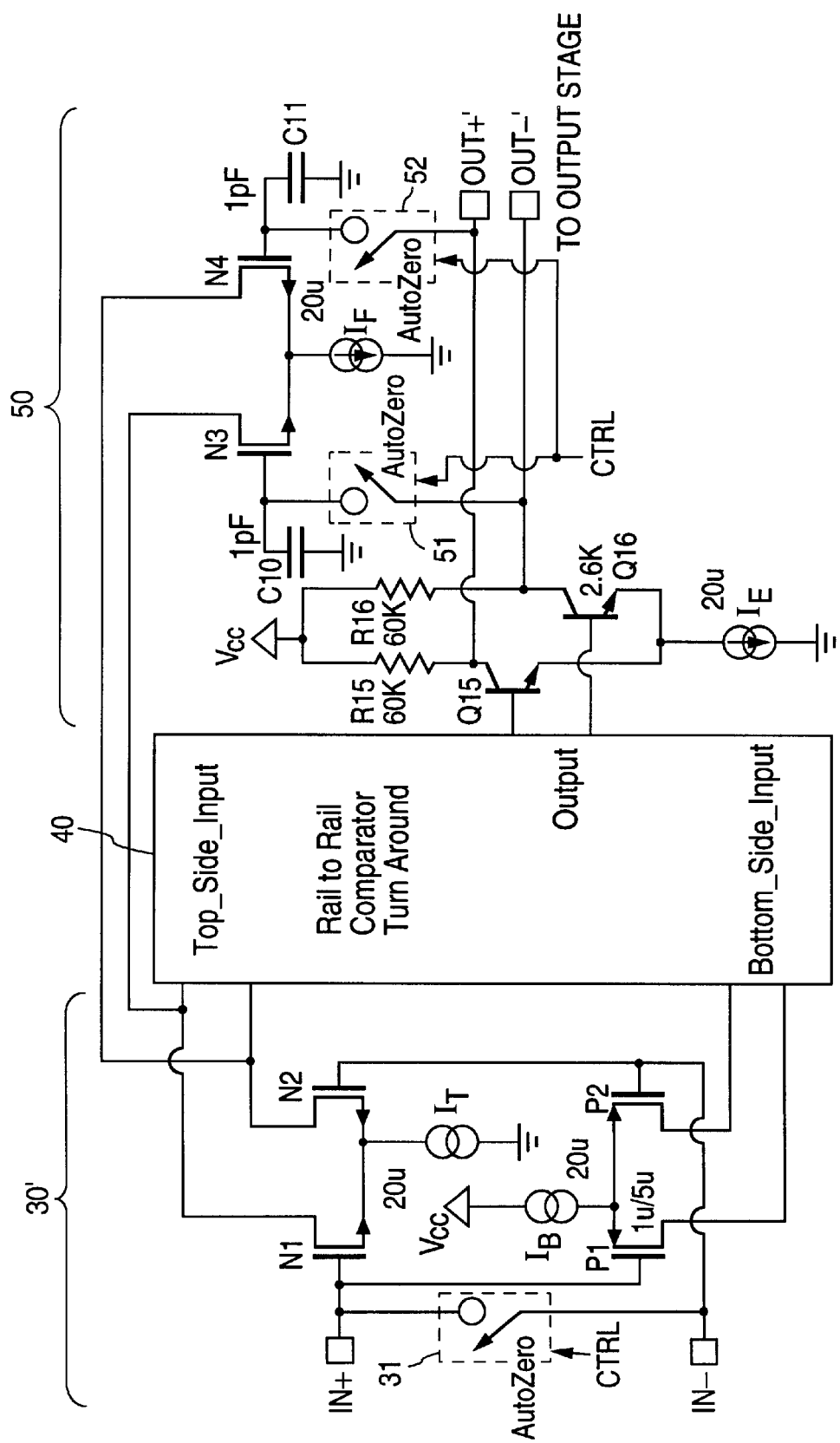
FIG. 5 is a simplified schematic diagram of another preferred embodiment of the invention, in which the comparator intermediate stage of FIG. 3 is coupled between a comparator input stage (having an autozero switch) and an interface circuit comprising autozero circuitry.

For this reason, it is convenient to add autozero circuitry of the type shown in FIG. 5 (to compensate for DC noise which would otherwise occur due to input stage offset) and use minimum geometry MOS transistors in stage 30 (which may exhibit large offset and cause larger than desired DC noise in the output signal of the inventive circuit), rather than to implement stage 30 with MOS transistors of larger physical size. In the preferred embodiment of the invention shown in FIG. 5, stage 40 of FIG. 3 is coupled between comparator input stage 30' (having autozero switch 31, but otherwise comprising the same components as stage 30 of FIG. 3) and interface circuit 50. Circuit 50 includes NPN bipolar transistors Q15 and Q16, resistors R15 and R16, current sink $I_E$, NMOS transistors N3 and N4, current sink $I_F$, and autozero switches 51 and 52 connected as shown. The base of transistor Q15 is coupled to output node OUT+ of stage 40, the collector of Q15 is coupled to resistor R15 (and to output node OUT+'), the base of transistor Q16 is coupled to output node OUT− of stage 40, the collector of Q16 is coupled to resistor R16 (and to output node OUT−"), and the emitters of Q15 and Q16 are coupled to current sink $I_E$ (so that the emitter currents of Q15 and Q16 sum to the constant tail current $I_E$). When switches 51 and 52 are closed (in response to control signal CTRL), the collector of Q16 is connected to the gate of transistor N3 (which is AC grounded by capacitor C10 as shown) and the collector of Q15 is connected to the gate of transistor N4 (which is AC grounded by capacitor C11 as shown). The drain of N3 is coupled to input node $V_1$ of stage 40, the drain of N4 is coupled to input node $V_2$ of stage 40, and current sink $I_F$ draws a constant current from the common sources of N3 and N4. When switches 51 and 52 are opened (in response to control signal CTRL), the difference between the potential at output node OUT+' and the potential at output node OUT−' is indicative of the difference between the potential at node OUT+ of stage 40 and the potential at node OUT− of stage 40 (in the sense that a change in the latter potential difference results in a corresponding change in the former potential difference). Output nodes OUT+' and OUT−' are intended to be coupled to the same nodes of the comparator output stage to which nodes OUT+ and OUT− of FIG. 3 would be coupled.

Typically, a rail-to-rail comparator embodying the invention will be a portion of an analog-to-digital converter ("ADC") integrated circuit. State of the art ADC chips often include auto-shutdown circuitry which places all analog circuitry within them in a state which consumes little or no power (e.g., an "off" state) unless a Chip Select signal is asserted to the ADC chip. Upon receiving such a Chip Select signal, the ADC chip executes an A-to-D conversion operation including the steps of input signal sample and hold, wake up, and then A-to-D conversion of the sampled input signal. Preferably, the auto zero operation performed by the FIG. 5 circuit is performed during such a "wake up" step.

In such preferred embodiments, at the start of the wake up step: control signal CTRL undergoes a transition to a value which closes each of switches 31, 51, and 52 (and potential difference $V_{cc}$ is applied across the top and bottom rails); no external signal is asserted to input node IN−; an external input signal asserted to input node IN+ is simultaneously asserted to the gates of N1 and P1 and through switch 31 to the gates of N2 and P2; the collector current of transistor Q15 (which is determined by the potential at node OUT+ of stage 40) is asserted (through switch 52) to the gate of N4; transistor N4 begins to draw current from input node $V_2$ of stage 40 (the channel current of N4 functions as feedback to input node $V_2$) ; the collector current of transistor Q16 (which is determined by the potential at node OUT− of stage 40) is asserted (through switch 51) to the gate of N3; and transistor N3 begins to draw current from input node $V_1$ of stage 40 (the channel current of N3 functions as feedback to input node $V_1$). Since the sum of the channel currents of transistors N3 and N4 is fixed, transistors N3 and N4 function as a gain killer which attempts to settle to zero the output (the differential output at nodes OUT+' and OUT−') in response to zero input (identical input at both nodes IN+ and IN−) through negative feedback. Since NMOS transistors N3 and N4 are biased like the input stage transistors N1 and N2, the loop gain is about 36 dB, and capacitors C10 and C11 (and the input transconductance of the NMOS transistors) compensate the negative feedback network to provide unity gain at 60 MHz.

The slowest transistors in the feedback loop are the common base driven lateral PNP transistors (Q3, Q4, Q6, and Q7) within stage 40. Transient analysis simulations on the FIG. 5 circuit, assuming the particular component characteristics shown in FIG. 5, (e.g., 60 KiloOhm values for resistors R15 and R16, and 1 picoFarad values for capacitors C10 and C11) have shown that the feedback loop is stable and that the loop rapidly attenuates DC noise in the output signal (due to offset) by a factor of 30 dB. Thus, the loop is expected to compensate effectively for DC noise (in the output provided to the comparator output stage) which would otherwise be present due to offset. The simulations also show that use of the feedback loop also aids in reducing the wake up settle time of the comparator.

Figure 6:
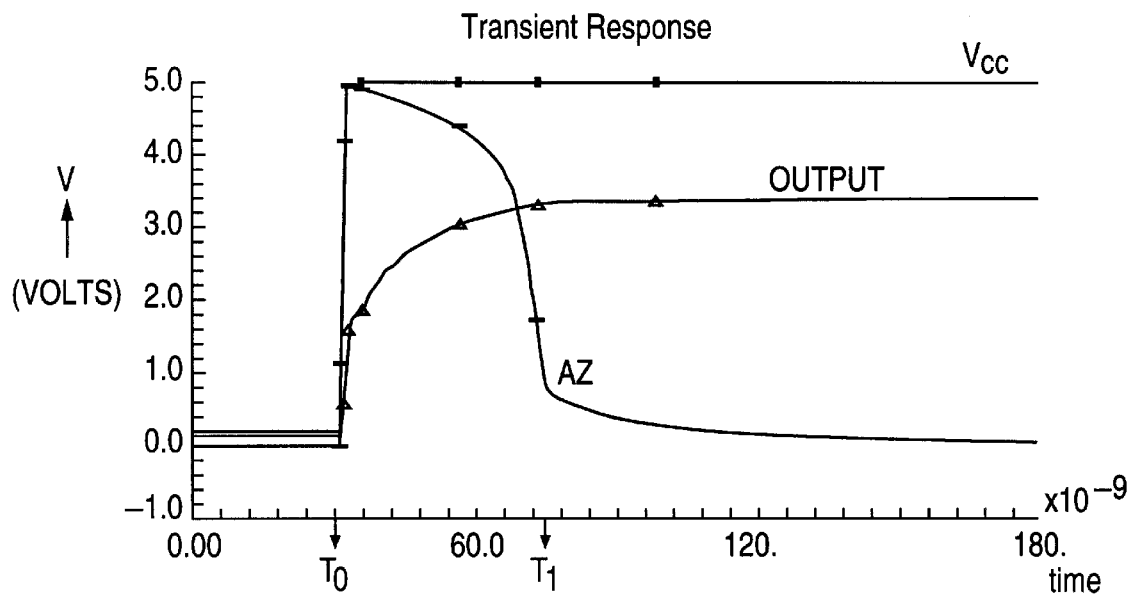
FIG. 6 is a graph representing the expected clean, rapid increase of the signal (identified as "OUTPUT" in FIG. 6) at one of the output nodes of the FIG. 5 circuit, which would occur in response to operating the FIG. 5 circuit in an autozero:Lng mode (occurring during an autozero period "AZ" beginning at time $T_0$).

FIG. 6 is a graph resulting from the mentioned transient analysis simulations, showing the clean (without transient spikes) and rapid increase of the output signal (identified as "OUTPUT" in FIG. 6) at output node OUT+' (or OUT−') of the FIG. 5 circuit which would occur in response to operating the FIG. 5 circuit in an autozeroing mode (during an autozero period "AZ" beginning at time $T_0$). The autozero period begins when switches 31, 51, and 52 are closed (and potential difference $V_{cc}$ applied across the top and bottom rails) at time $T_0$, and ends a brief time later (at about time $T_1$).

After operating the FIG. 5 circuit in an autozeroing mode (typically, at the end of a wake up period during which autozeroing is performed), the value of control signal CTRL is changed to cause switches 31, 51 and 52 to open, and signals IN+ and IN− (comprising the differential input potential) are asserted to input nodes IN+ and IN− respectively (signal IN+ is asserted to the gates of N1 and P1 and signal IN− is asserted to the gates of N2 and P2). In this state, the FIG. 5 circuit operates with full AC gain to produce a differential output signal (at nodes OUT+' and OUT−') indicative of the differential input potential, but does so with reduced DC offset as a result of having undergone autozeroing (typically during the wakeup period).

Throughout the specification, including in the claims, the terms "connected" and "coupled" are used interchangeably, in a broad sense denoting either a direct electrical connection between the things connected or coupled (with no intermediate devices) or an indirect connection (e.g., through one or more passive or active intermediate devices).

Preferred embodiments of the invention have been described with reference to FIGS. 2–5. Although these embodiments have been described in some detail, it is contemplated that many changes from (and variations on) these embodiments can be made without departing from the spirit and scope of the invention as defined by the appended claims.

What is claimed is:

1. An interface stage suitable for interfacing between an input stage of a rail to rail comparator and an output stage of the rail to rail comparator, said interface stage comprising:

a top rail and a bottom rail, connectable to a source of operating power;

first amplifier circuitry connected to the top rail and comprising a set of bipolar PNP transistors connected in a common base configuration and configured to amplify a first input current from the input stage and a second input current from the input stage to generate a first set of amplified currents;

second amplifier circuitry connected to the bottom rail and comprising a set of bipolar NPN transistors connected in a common base configuration and configured to amplify a third input current from the input stage and a fourth input current from the input stage to generate a second set of amplified currents;

first virtual ground circuitry coupled between the first amplifier circuitry and the second amplifier circuitry, and configured to assert to a first output node a first output potential indicative of a first linear combination of a subset of the first set of amplified currents and a subset of the second set of amplified currents; and second virtual ground circuitry coupled between the first amplifier circuitry and the second amplifier circuitry, and configured to assert to a second output node a second output potential indicative of a linear combination of another subset of the first set of amplified currents and another subset of the second set of amplified currents, wherein the first input current, the second input current, the third input current, and the fourth input current are together indicative of a differential input signal, and the first output potential and the second output potential comprise a differential output signal indicative of the differential input signal and suitable for driving the output stage.

2. The interface stage of claim 1, wherein the first virtual ground circuitry comprises:
a resistor coupled between a first node and the first output node; and
a first NPN bipolar transistor having a base coupled to the first node, a collector coupled to the first output node, and an emitter coupled to the common bases of the set of bipolar NPN transistors, wherein the first set of amplified currents includes a first amplified current asserted to the first node, and the second set of amplified currents includes a second amplified current asserted to said first node.

3. The interface stage of claim 2, wherein the second virtual ground circuitry comprises:
a second resistor coupled between a second node and the second output node; and
a second NPN bipolar transistor having a base coupled to the second node, a collector coupled to the second output node, and an emitter coupled to the common bases of the set of bipolar NPN transistors, wherein the first set of amplified currents includes a third amplified current asserted to the second node, and the second set of amplified currents includes a fourth amplified current asserted to said second node.

4. The interface stage of claim 3, wherein said interface stage has an input transconductance and a slew rate, and the slew rate is principally determined by the input transconductance and the collector-to-base stray capacitance of the first NPN bipolar transistor.

5. The interface stage of claim 1, wherein the bipolar PNP transistors of the first amplifier circuitry are lateral PNP bipolar transistors whose common bases are coupled to an AC ground.

6. The interface stage of claim 1, wherein the first amplifier circuitry comprises a set of resistors, each of the resistors coupled between the top rail and an emitter of a different one of the bipolar PNP transistors of said first amplifier circuitry, and
said second amplifier circuitry comprises a second set of resistors, each of the resistors in said second set being coupled between the bottom rail and an emitter of a different one of the bipolar NPN transistors of said second amplifier circuitry.

7. The interface stage of claim 6, wherein the emitter of a first one of the bipolar PNP transistors of the first amplifier circuitry is coupled to receive the first input current, the emitter of another one of the bipolar PNP transistors of the first amplifier circuitry is coupled to receive the second input current, the emitter of a first one of the bipolar NPN transistors of the second amplifier circuitry is coupled to receive the third input current, and the emitter of another one of the bipolar NPN transistors of the second amplifier circuitry is coupled to receive the fourth input current.

8. Circuitry for amplifying a differential input signal, to generate a differential output signal indicative of the differential input signal and suitable for driving an output stage of a rail to rail comparator, said circuitry comprising:
a top rail and a bottom rail connectable to a source of operating power;
an input stage, including an NMOS transistor differential amplifier coupled to the bottom rail and configured to receive the differential input signal and assert a first current and a second current in response to the differential input signal, and a PMOS transistor differential amplifier coupled to the top rail and configured to receive the differential input signal and assert a third current and a fourth current in response to said differential input signal, wherein the first current, the second current, the third current, and the fourth current are together indicative of the differential input signal; and
an interface stage, said interface stage including:
first amplifier circuitry connected to the top rail and comprising a set of bipolar PNP transistors connected in a common base configuration and configured to receive and amplify the first current and the second current from the input stage to generate a first set of amplified currents;
second amplifier circuitry connected to the bottom rail and comprising a set of bipolar NPN transistors connected in a common base configuration and configured to receive and amplify the third current and the fourth current from the input stage to generate a second set of amplified currents;
first virtual ground circuitry coupled between the first amplifier circuitry and the second amplifier circuitry, and configured to assert to a first output node a first output potential indicative of a first linear combination of a subset of the first set of amplified currents and a subset of the second set of amplified currents; and
second virtual ground circuitry coupled between the first amplifier circuitry and the second amplifier circuitry, and configured to assert to a second output node a second output potential indicative of a linear combination of another subset of the first set of amplified currents and another subset of the second set of amplified currents, wherein the first output potential and the second output potential comprise said differential output signal.

9. The circuitry of claim 8, wherein the first virtual ground circuitry comprises:
a resistor coupled between a first node and the first output node; and
a first NPN bipolar transistor having a base coupled to the first node, a collector coupled to the first output node, and an emitter coupled to the common bases of the set of bipolar NPN transistors, wherein the first set of amplified currents includes a first amplified current asserted to the first node, and the second set of amplified currents includes a second amplified current asserted to said first node.

10. The circuitry of claim 9, wherein the second virtual ground circuitry comprises:

a second resistor coupled between a second node and the second output node; and a second NPN bipolar transistor having a base coupled to the second node, a collector coupled to the second output node, and an emitter coupled to the common bases of the set of bipolar NPN transistors, wherein the first set of amplified currents includes a third amplified current asserted to the second node, and the second set of amplified currents includes a fourth amplified current asserted to said second node.

11. The circuitry of claim 10, wherein each of the first NPN bipolar transistor, the second NPN bipolar transistor, the bipolar PNP transistors, and the bipolar NPN transistors has minimum geometry.

12. The circuitry of claim 10, wherein the interface stage has an input transconductance and a slew rate, and the slew rate is principally determined by the input transconductance and the collector-to-base stray capacitance of the first NPN bipolar transistor.

13. The circuitry of claim 8, wherein the bipolar PNP transistors of the first amplifier circuitry are lateral PNP bipolar transistors whose common bases are coupled to an AC ground.

14. The circuitry of claim 8, wherein the first amplifier circuitry comprises a set of resistors, each of the resistors coupled between the top rail and an emitter of a different one of the bipolar PNP transistors of said first amplifier circuitry, and said second amplifier circuitry comprises a second set of resistors, each of the resistors in said second set being coupled between the bottom rail and an emitter of a different one of the bipolar NPN transistors of said second amplifier circuitry.

15. The circuitry of claim 14, wherein the emitter of a first one of the bipolar PNP transistors of the first amplifier circuitry is coupled to receive the first current, the emitter of another one of the bipolar PNP transistors of the first amplifier circuitry is coupled to receive the second current, the emitter of a first one of the bipolar NPN transistors of the second amplifier circuitry is coupled to receive the third current, and the emitter of another one of the bipolar NPN transistors of the second amplifier circuitry is coupled to receive the fourth current.

16. The circuitry of claim 18, wherein the differential input signal is a differential input potential having any value in a range from the bottom rail potential to the top rail potential, the first current and the second current together comprise a first amplified differential input signal for the interface stage, the third current and the fourth current together comprise a second amplified differential input signal for the interface stage, the first amplified differential input signal is indicative of the differential input potential over said range except for a bottom portion of the range close to the bottom rail potential, and the second amplified differential input signal is indicative of the differential input potential over said range other than a top portion of the range close to the top rail potential.

17. The circuitry of claim 8, wherein the differential input signal comprises a first potential and a second potential, the NMOS transistor differential amplifier has a first input coupled to receive the first potential and a second input coupled to receive the second potential, the PMOS transistor differential amplifier has a third input coupled to receive the first potential and a fourth input coupled to receive the second potential, and the input stage comprises an autozero switch between the first input and the third input, and wherein the interface stage includes autozero circuitry coupled to the first output node, the second output node, and the first amplifier circuitry, wherein the autozero circuitry is configured to execute an autozero operation, in response to a control signal, in which DC noise, due to offset, in the differential output signal is attenuated by means of a negative feedback loop.

18. Circuitry for amplifying a differential input signal to generate a differential output signal indicative of the differential input signal, wherein the differential output signal is suitable for driving an output stage of a rail to rail comparator, and the differential input signal comprises a first potential and a second potential, said circuitry comprising:

a top rail and a bottom rail connectable to a source of operating power;

an input stage, including an NMOS transistor differential amplifier coupled to the bottom rail and configured to receive the differential input signal and assert a first current and a second current in response to the differential input signal, and a PMOS transistor differential amplifier coupled to the top rail and configured to receive the differential input signal and assert a third current and a fourth current in response to said differential input signal, wherein the first current, the second current, the third current, and the fourth current are together indicative of the differential input signal, the NMOS transistor differential amplifier has a first input coupled to receive the first potential and a second input coupled to receive the second potential, the PMOS transistor differential amplifier has a third input coupled to receive the first potential and a fourth input coupled to receive the second potential, and wherein the input stage also includes an autozero switch between the first input and the third input, said autozero switch being configured to enter a closed configuration connecting the first input to the third input in response to a control signal having a first value; and an interface stage, the interface stage including:

first amplifier circuitry connected to the top rail and comprising a set of bipolar transistors configured to receive and amplify the first current and the second current from the input stage to generate a first set of amplified currents;

second amplifier circuitry connected to the bottom rail and comprising a second set of bipolar transistors configured to receive and amplify the third current and the fourth current from the input stage to generate a second set of amplified currents;

first virtual ground circuitry coupled between the first amplifier circuitry and the second amplifier circuitry, and configured to assert to a first output node a first output potential indicative of a first linear combination of a subset of the first set of amplified currents and a subset of the second set of amplified currents;

second virtual ground circuitry coupled between the first amplifier circuitry and the second amplifier circuitry, and configured to assert to a second output node a second output potential indicative of a linear combination of another subset of the first set of amplified currents and another subset of the second set of amplified currents; and autozero circuitry coupled to the first output node, the second output node, and the first amplifier circuitry, wherein the autozero circuitry is configured to execute an autozero operation in response to said control signal having the first value, wherein the autozero circuitry attenuates DC noise, due to offset, in the differential output signal by means of a negative feedback loop.

19. The circuitry of claim 18, wherein the set of bipolar transistors is a set of bipolar PNP transistors connected in a common base configuration, and the second set of bipolar transistors is a set of bipolar NPN transistors connected in a common base configuration.

20. The circuitry of claim 19, wherein the autozero circuitry comprises:

a bipolar transistor differential amplifier coupled between the top rail and the bottom rail, and having an input coupled to the first output node, another input coupled to the second output node, a first output coupled to a final output node, and a second output coupled to a second output node, and configured to assert a third output potential at the first final output node in response to the first output potential and to assert a fourth output potential at the second final output node in response to the second output potential, wherein the third output potential and the fourth output potential comprise said differential output signal;

a second autozero switch between the first final output node and a third node, the second autozero switch being configured to enter a closed configuration connecting the first final output node to the third node in response to the control signal having said first value; and a third autozero switch between the second final output node and a fourth node, the third autozero switch being configured to enter a closed configuration connecting the second final output node to the fourth node in response to the control signal having said first value; and a second NMOS transistor differential amplifier coupled to the bottom rail and having a first input coupled to the fourth node, a second input coupled to the third node, a first output coupled to the first amplifier circuitry, and a second output coupled to the first amplifier circuitry, the second NMOS transistor differential amplifier being configured to generate a first feedback current and combine said first feedback current with the first current when the third autozero switch is in its closed configuration, and to generate a second feedback current and combine said first feedback current with the second current when the second autozero switch is in its closed configuration.

21. The circuitry of claim 19, wherein the first virtual ground circuitry comprises:

a resistor coupled between a first node and the first output node; and a first NPN bipolar transistor having a base coupled to the first node, a collector coupled to the first output node, and an emitter coupled to the common bases of the set of bipolar NPN transistors, wherein the first set of amplified currents includes a first amplified current asserted to the first node, and the second set of amplified currents includes a second amplified current asserted to said first node.

22. The circuitry of claim 21, wherein the second virtual ground circuitry comprises:

a second resistor coupled between a second node and the second output node; and a second NPN bipolar transistor having a base coupled to the second node, a collector coupled to the second output node, and an emitter coupled to the common bases of the set of bipolar NPN transistors, wherein the first set of amplified currents includes a third amplified current asserted to the second node, and the second set of amplified currents includes a fourth amplified current asserted to said second node.

23. The circuitry of claim 22, wherein the NMOS transistor differential amplifier includes at least two NMOS transistors, the PMOS transistor differential amplifier includes at least two PMOS transistors, and each of the first NPN bipolar transistor, the second NPN bipolar transistor, the bipolar PNP transistors, the bipolar NPN transistors, the NMOS transistors, and the PMOS transistors has minimum geometry.

24. The circuitry of claim 22, wherein the interface stage has an input transconductance and a slew rate, and the slew rate is principally determined by the input transconductance and the collector-to-base stray capacitance of the first NPN bipolar transistor.

* * * * *